(12) United States Patent
Homma

(10) Patent No.: US 8,804,099 B2
(45) Date of Patent: Aug. 12, 2014

(54) MAGNETIC SUPPORTING MECHANISM HAVING A MOVABLE MAGNET WITH A VARYING WIDTH, EXPOSURE APPARATUS WITH THE MAGNETIC SUPPORTING MECHANISM, AND DEVICE MANUFACTURING METHOD THEREOF

(75) Inventor: Masato Homma, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 565 days.

(21) Appl. No.: 12/916,355

(22) Filed: Oct. 29, 2010

(65) Prior Publication Data
US 2011/0109895 A1      May 12, 2011

(30) Foreign Application Priority Data
Nov. 11, 2009   (JP) .................................. 2009-258403

(51) Int. Cl.
G03B 27/58      (2006.01)
G03F 7/20       (2006.01)
H02N 15/00      (2006.01)

(52) U.S. Cl.
CPC ............ *G03F 7/70066* (2013.01); *H02N 15/00* (2013.01)
USPC ....................................................... 355/74

(58) Field of Classification Search
CPC ............................ G03F 7/70066; H02N 15/00
USPC ................................................ 355/74; 310/12
See application file for complete search history.

(56) References Cited

U.S. PATENT DOCUMENTS

| 6,954,041 B2 | 10/2005 | Korenaga |
| 7,211,908 B2 * | 5/2007 | Tamaki ................... 310/12.25 |
| 7,359,037 B2 * | 4/2008 | Carter et al. ................ 355/71 |

FOREIGN PATENT DOCUMENTS

| JP | 2001-284438 A | 10/2001 |
| JP | 2003-343559 A | 12/2003 |

* cited by examiner

Primary Examiner — Chia-how Michael Liu
(74) *Attorney, Agent, or Firm* — Rossi, Kimms & McDowell LLP (57) ABSTRACT

A magnetic supporting mechanism which comprises first to fourth magnets having first to fourth magnetic poles, in which the third magnet is partially inserted into a gap between the first and second magnets so that the first and third magnetic poles face each other and the second and fourth magnetic poles face each other, and which supports a supporting target to be movable in a second direction, in which the third magnet is inserted, of two directions perpendicular to a first direction in which the first and second magnetic poles face each other, wherein the third magnet is formed such that an effective width across which a magnetic force acts in a third direction perpendicular to both the first and second directions is narrower at a second end thereof opposite to a first end thereof inserted between the first and second magnets than at the first end.

5 Claims, 8 Drawing Sheets

MAGNETIC SUPPORTING MECHANISM HAVING A MOVABLE MAGNET WITH A VARYING WIDTH, EXPOSURE APPARATUS WITH THE MAGNETIC SUPPORTING MECHANISM, AND DEVICE MANUFACTURING METHOD THEREOF

BACKGROUND OF THE INVENTION

1. Field of the Invention

The present invention relates to a technique of supporting a supporting target by the magnetic repulsive forces of magnets which face each other.

2. Description of the Related Art

These days, to meet demands for finer patterning and higher throughputs of semiconductor devices, the size of an exposure apparatus itself is increasing due to, for example, an increase in wafer size, an increase in NA of an exposure optical system, and an improvement in throughput of the exposure apparatus. An exposure apparatus of the scanning exposure scheme is the recent mainstream. In this scheme, the exposure apparatus exposes a wafer to slit-shaped illumination light while synchronously scanning a reticle and the wafer.

With this increase in size of an exposure apparatus, the sizes of actuators which form driving mechanisms for stages and other members are, in turn, increasing. Therefore, the structure of the exposure apparatus often deforms due to heat generated by the actuators and fluctuations in characteristic of the actuators, and this hampers finer patterning of semiconductor devices. Under the circumstance, a demand has arisen for a supporting mechanism which supports a movable element of a large, heavy actuator with a predetermined supporting force within its movable range. Unfortunately, even if a supporting mechanism is formed so as to suppress heat generation, its supporting force disadvantageously largely fluctuates within the movable range of the movable element.

Japanese Patent Laid-Open No. 2001-284438 describes a magnetic supporting mechanism including magnets disposed on a levitating unit 2 (movable unit) and a stator unit 1 such that their attraction forces act on these units. This magnetic supporting mechanism includes a magnetic means 21 for suppressing an increase in leakage flux due to an increase in width of an air gap to suppress an increase in leakage flux, thereby decreasing a change in supporting force even upon a change in width of the air gap.

Also, Japanese Patent Laid-Open No. 2003-343559 describes a magnetic supporting mechanism in which magnets are disposed on a movable unit 31 and a stator unit 32 such that their poles of the same polarity face each other, and which levitates these units by means of the repulsive forces of the magnets. The magnets on the stator unit 32 are juxtaposed parallel to each other, and the magnet on the movable magnet 31 is pushed into the space between the former magnets such that the former and latter magnets have their poles of the same polarities facing each other. In the magnetic supporting mechanism, the supporting force increases up to a predetermined position as the movable magnet is pushed into the space between the stator magnets, but the position of the movable magnet and the supporting force become nearly constant in a certain region.

In Japanese Patent Laid-Open No. 2001-284438, the distance between the magnetic poles of the movable unit and stator unit, including their interpoles, changes depending on the position of the movable unit, so the magnetic attraction force also changes. That is, a change in position of the movable unit corresponds to a change in distance between the magnetic poles, and this, in turn, increases a change in magnetic force. Therefore, only a small effect of decreasing a change in supporting force corresponding to the position of the movable unit can be obtained in that case. In this case, therefore, when a large supporting force is necessary, the supporting force largely differs depending on the position of the movable unit.

In Japanese Patent Laid-Open No. 2003-343559, the relationship between the levitating position and levitating force of the magnet is shown in FIG. 4. According to this relationship, the levitating force does not become constant in a certain region, so part of the curve of the levitating force, which changes from an increase to a decrease, is used. This makes it difficult to move a region where a change in levitating force is small, and widen this region. That is, the range in which a change in levitating force is decreased is so small that the movable range of the movable magnet, within which this decrease is possible, is limited to a narrow region. In this case, therefore, when the movable range is wide, the supporting force largely differs depending on the position of the movable unit.

In this manner, when a large supporting force or a wide movable range is necessary, the conventional magnetic supporting mechanism requires an actuator which adjusts the difference in supporting force corresponding to the position of the movable unit, so the actuator generates heat in order to generate a force for adjusting that difference.

SUMMARY OF THE INVENTION

The present invention has been made in consideration of the aforementioned problems, and realizes a magnetic supporting mechanism which can decrease a change in supporting force in the movable range of a supporting target.

In order to solve the aforementioned problems, the present invention provides a magnetic supporting mechanism which comprises a first magnet having a first magnetic pole, a second magnet having a second magnetic pole opposed to the first magnetic pole, and a third magnet having a third magnetic pole of a polarity identical to a polarity of the first magnetic pole and a fourth magnetic pole of a polarity identical to a polarity of the second magnetic pole, in which the third magnet is partially inserted into a gap between the first magnet and the second magnet so that the first magnetic pole and the third magnetic pole face each other and the second magnetic pole and the fourth magnetic pole face each other, and which, assuming one of a pair of the first magnet and the second magnet and the third magnet as a stator unit, and the other one of the pair of the first magnet and the second magnet and the third magnet as a movable unit, supports a supporting target, connected to the movable unit, to be movable in a second direction, in which the third magnet is inserted, of two directions perpendicular to a first direction in which the first magnetic pole and the second magnetic pole face each other, wherein the third magnet is formed such that an effective width across which a magnetic force acts in a third direction perpendicular to both the first direction and the second direction is narrower at a second end thereof opposite to a first end thereof inserted between the first magnet and the second magnet than at the first end.

In order to solve the aforementioned problems, the present invention provides a magnetic supporting mechanism which comprises a first magnet having a first magnetic pole, a second magnet having a second magnetic pole opposed to the first magnetic pole, and a third magnet having a third magnetic pole of a polarity identical to a polarity of the first magnetic pole and a fourth magnetic pole of a polarity identical to a polarity of the second magnetic pole, in which the third magnet is partially inserted into a gap between the first magnet and the second magnet so that the first magnetic pole and the third magnetic pole face each other and the second magnetic pole and the fourth magnetic pole face each other, and which, assuming one of a pair of the first magnet and the second magnet and the third magnet as a stator unit, and the other one of the pair of the first magnet and the second magnet and the third magnet as a movable unit, supports a supporting target, connected to the movable unit, to be movable in a second direction, in which the third magnet is inserted, of two directions perpendicular to a first direction in which the first magnetic pole and the second magnetic pole face each other, wherein the pair of the first magnet and the second magnet are formed such that an effective width across which a magnetic force acts in a third direction perpendicular to both the first direction and the second direction narrows from first ends of the first magnet and the second magnet, which are on a side on which the third magnet is inserted, to second ends thereof opposite to the first ends.

In order to solve the aforementioned problems, the present invention provides a magnetic supporting mechanism which comprises a first magnet having a first magnetic pole, a second magnet having a second magnetic pole opposed to the first magnetic pole, and a third magnet having a third magnetic pole of a polarity identical to a polarity of the first magnetic pole and a fourth magnetic pole of a polarity identical to a polarity of the second magnetic pole, in which the third magnet is partially inserted into a gap between the first magnet and the second magnet so that the first magnetic pole and the third magnetic pole face each other and the second magnetic pole and the fourth magnetic pole face each other, and which, assuming one of a pair of the first magnet and the second magnet and the third magnet as a stator unit, and the other one of the pair of the first magnet and the second magnet and the third magnet as a movable unit, supports a supporting target, connected to the movable unit, to be movable in a second direction, in which the third magnet is inserted, of two directions perpendicular to a first direction in which the first magnetic pole and the second magnetic pole faces each other, wherein when viewed from the first direction, a rate of increase in area that the first magnet and the third magnet overlap each other decreases as the third magnet is inserted deeper in the second direction.

In order to solve the aforementioned problems, the present invention provides an exposure apparatus comprising a stage apparatus which relatively and movably holds a substrate and an original, and an illumination apparatus which forms illumination light to transfer a pattern of the original onto the substrate by exposure, wherein a driving unit configured to drive a light-shielding unit of the illumination apparatus is supported by a magnetic supporting mechanism as defined above.

In order to solve the aforementioned problems, the present invention provides a device manufacturing method comprising the steps of: exposing a substrate using an exposure apparatus as defined above; and developing the exposed substrate.

According to the present invention, it is possible to decrease a change in supporting force in the movable range of a supporting target.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

The following embodiments are merely examples for practicing the present invention. The embodiments should be properly modified or changed depending on various conditions and the structure of an apparatus to which the present invention is applied. The present invention should not be limited to the following embodiments.

[Configuration of Magnetic Supporting Mechanism]

Figure 7:
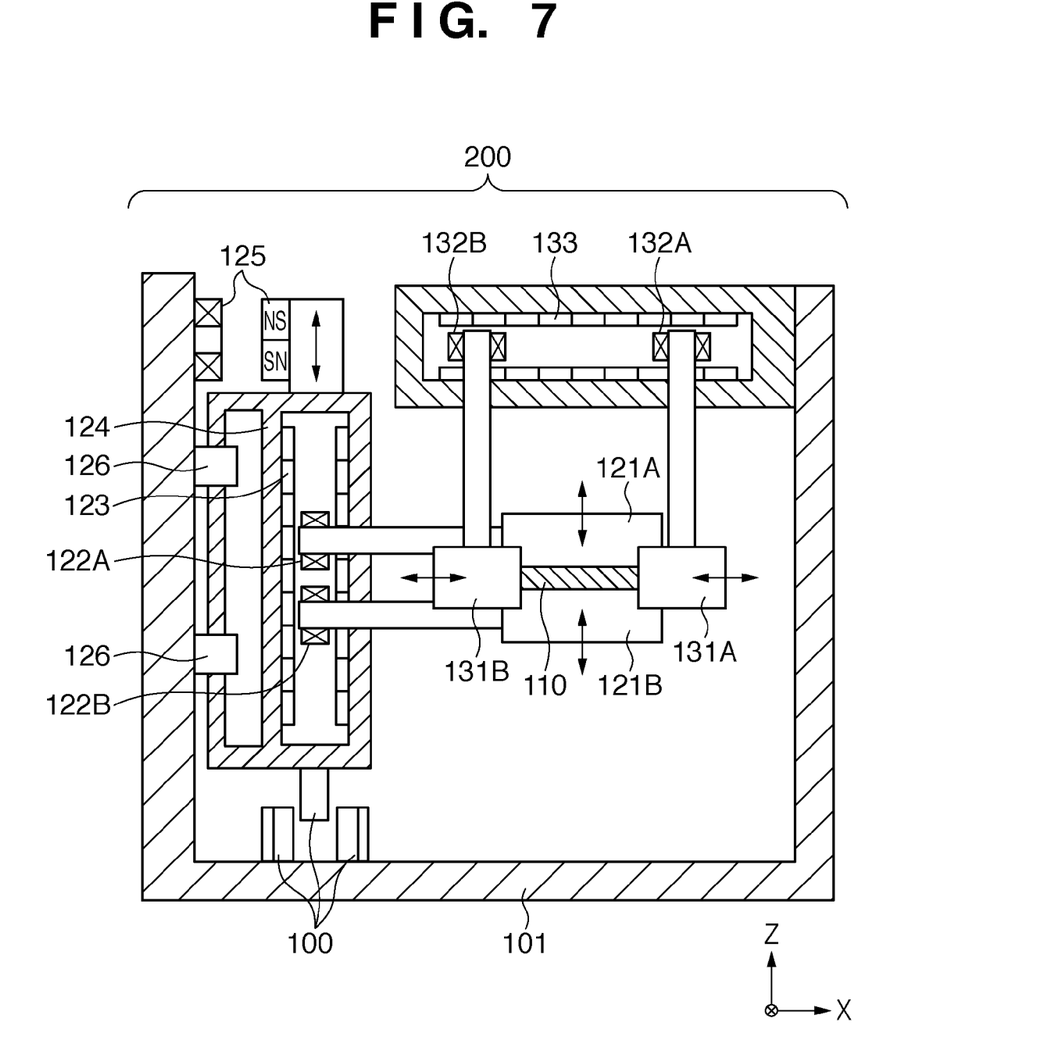
FIG. 7 is a diagram showing a light-shielding apparatus to which the magnetic supporting mechanism according to the present invention is applied.

FIG. 7 is a diagram showing the configuration of a light-shielding apparatus to which a magnetic supporting mechanism in an embodiment according to the present invention is applied. An example in which the magnetic supporting mechanism according to the present invention is applied to a light-shielding apparatus 200 built in an exposure apparatus for printing a pattern on a wafer by exposure to manufacture a semiconductor device will be explained below. Referring to FIG. 7, the light-shielding apparatus 200 scans a light-shielding unit in synchronism with a reticle (original) and a wafer (substrate) (neither is shown) so as to prevent any unwanted exposure region from being irradiated with illumination light. A blade serving as the light-shielding unit includes X blades 131A and 131B which move horizontally (in the X direction), and Z blades 121A and 121B which move vertically (in the Z direction), in order to define a rectangular irradiation region 110. Among these blades, the Z blades 121A and 121B are used to synchronously scan the reticle and the wafer. When the Z blades 121A and 121B move, a blade driving unit 124 including a linear motor 123 generates a driving reaction force, which acts, as vibration disturbance, on an illumination supporting unit 101 serving as a blade supporting unit. To cancel this driving reaction force, a mechanism called a counter-mass or a counterweight is available. The counter-mass is a mechanism which moves a mass body in the direction opposite to the moving direction of a moving body to cancel the influence of a reaction force generated upon movement of the moving body.

In the light-shielding apparatus 200 in this example, movable elements of the Z blades 121A and 121B are moved by the linear motor 123, while those of the X blades 131A and 131B are moved by a linear motor 133. When the Z blades 121A and 121B move in the −Z direction, their driving reaction forces can be cancelled by moving the blade driving unit 124 in the +Z direction along a slider 126 using its driving reaction force. Similarly, when the Z blades 121A and 121B move in the +Z direction, their driving reaction forces can be cancelled by moving the blade driving unit 124 in the −Z direction. However, in this method, the blade driving unit 124 always generates a force resulting from its self weight in the −Z direction, and therefore may be hindered from moving in the Z direction. Hence, to cancel the force resulting from the self weight of the blade driving unit 124, a magnetic supporting mechanism 100 which performs self weight compensation supports the blade driving unit 124. The magnetic supporting mechanism 100 supports the force corresponding to the self weight of the blade driving unit 124 with a predetermined magnetic repulsive force within its movable range. Even if the supporting force of the magnetic supporting mechanism 100 fluctuates within the movable range of the blade driving unit 124 as the supporting target, an actuator 125 can control this force.

[First Embodiment]

Figure 1A:
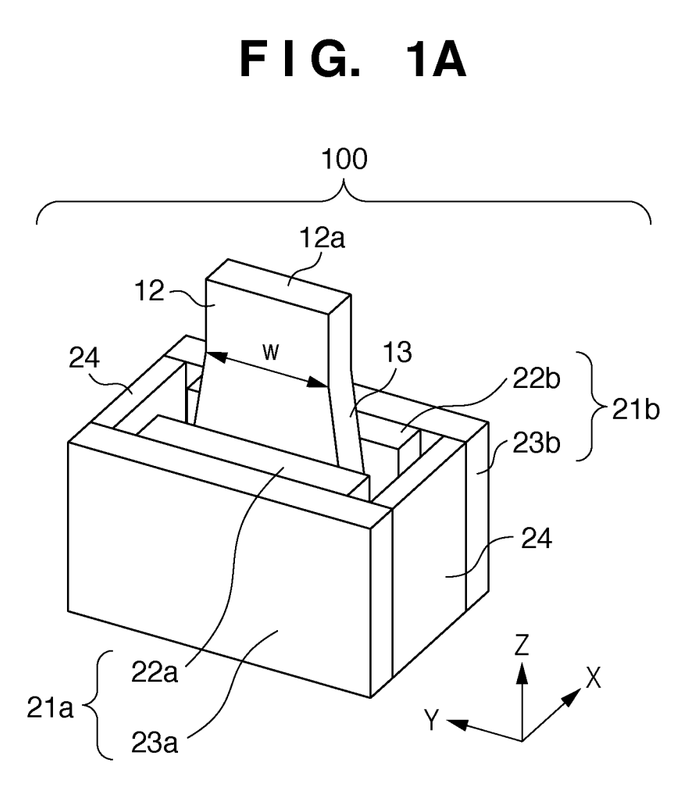
FIGS. 1A and 1B are perspective views showing a magnetic supporting mechanism in the first embodiment according to the present invention.
Figure 1B:
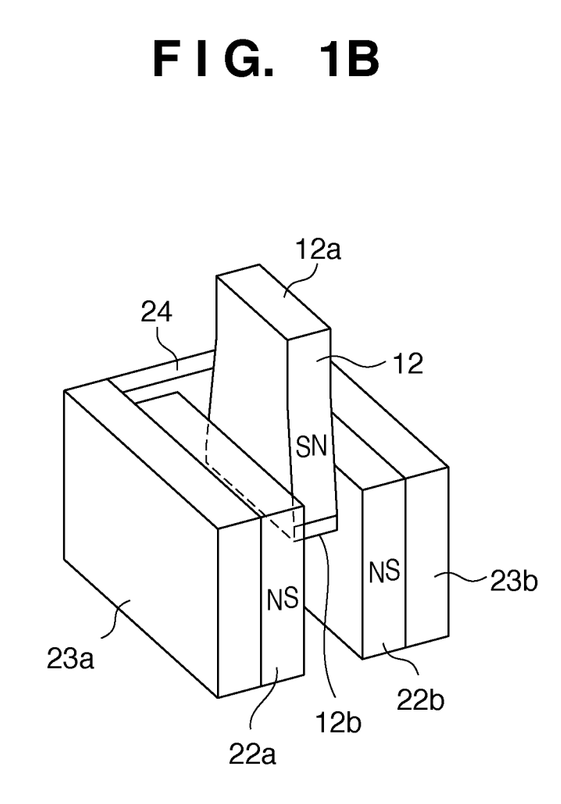

FIGS. 1A and 1B are perspective views showing a magnetic supporting mechanism 100 in the first embodiment according to the present invention when viewed from different directions. The magnetic supporting mechanism 100 includes a first stator unit 21a in which a first magnet 22a having a first magnetic pole (south pole) is fixed on a first yoke 23a. The magnetic supporting mechanism 100 also includes a second stator unit 21b in which a second magnet 22b having a second magnetic pole (north pole) parallelly opposed to the first magnetic pole (south pole) with a constant spacing between them in the X direction is fixed on a second yoke 23b. The magnetic supporting mechanism 100 moreover includes a third magnet 12 having a third magnetic pole (south pole) of a polarity identical to that of the first magnetic pole and a fourth magnetic pole (north pole) of a polarity identical to that of the second magnetic pole. The third magnet 12 is partially, movably inserted into the gap between the first magnet 22a and the second magnet 22b so that the first magnetic pole and the third magnetic pole face each other, and the second magnetic pole and the fourth magnetic pole face each other. In the foregoing configuration, one of a pair of first and second magnets 22a and 22b and the third magnet 12 is assumed as a stator unit, and the other one of the pair of first and second magnets 22a and 22b and the third magnet 12 is assumed as a movable unit. In this way, the supporting target connected to the movable unit is supported to be movable in a second direction (Z direction), in which the third magnet 12 is inserted, of two directions (Y and Z directions) perpendicular to a first direction (X direction) in which the first magnetic pole and the second magnetic pole face each other. That is, the magnetic supporting mechanism 100 supports the third magnet 12 in a noncontact manner by means of a magnetic repulsive force in the Z direction generated as the first magnetic pole of the first magnet 22a and the second magnetic pole of the second magnet 22b face the magnetic poles of the same polarities of the third magnet 12, respectively.

Although a pair of first and second magnets 22a and 22b will be assumed as a stator unit, and the third magnet 12 will be assumed as a movable unit hereinafter, an equivalent effect can be produced even if the third magnet 12 is assumed as a stator unit, and the pair of first and second magnets 22a and 22b are assumed as a movable unit, as a matter of course. This is because the effective width of one magnet changes, while that of the other magnet stays constant.

The third magnet 12 is formed such that the effective width w across which a magnetic force acts in a third direction (Y direction) is narrower at a second end 12a opposite to a first end 12b inserted between the first magnet 22a and the second magnet 22b than at the first end 12b. In other words, the pole face of the third magnet 12 is formed such that the effective width or area across which a magnetic force acts narrows in the +Z direction from the first end 12b. Again, in other words, the effective width or area across which a magnetic force acts is formed such that the rate of increase in area that its pole face overlaps the pole faces of the magnets 22a and 22b which gets lower as it is inserted deeper. Namely, when viewed from the first direction (X direction), the effective width or area is formed such that the rate of increase in area that the first magnet and the third magnet overlaps each other decreases as the third magnet is inserted deeper in the second direction (−Z direction).

In this embodiment, inclined portions 13 are formed at the two ends of the third magnet 12 in the Y direction. The inclined portions 13 are formed such that the width w of the third magnet 12 in the Y direction is narrower at the second end 12a opposite to the first end 12b inserted between the first and second magnets 22a and 22b than at the first end 12b. The inclined portions 13 are formed at least partially or as a whole, and may be linear or curved.

Note that the effective width means the effective dimension or area across which the magnetic forces from magnetic poles that face each other act, and corresponds to the width w in the Y direction in the first embodiment.

The first yoke 23a, the second yoke 23b, and yokes 24 which extend in the X direction and connect the yokes 23a and 23b to each other are not indispensable for the magnetic supporting mechanism 100 in this embodiment. When the yokes 23a, 23b, and 24 are adopted in this embodiment, the intervals between the first magnetic pole of the first magnet 22a and the third magnetic pole of the third magnet 12 and between the second magnetic pole of the second magnet 22b and the fourth magnetic pole of the third magnet 12 must be maintained constant. Hence, a displacement in the X and Y directions is desirably restricted by disposing, for example, a guide mechanism which can move only in the Z direction. The arrangement of the magnetic poles need not always be as shown in FIGS. 1A and 1B as long as the first and second magnets 22a and 22b and the third magnet 12 are disposed such that their magnetic poles of the same polarities face each other. As long as the foregoing conditions are satisfied, one or a plurality of pairs of first and second magnets 22a and 22b, and one or a plurality of third magnets 12 may be used.

Figure 2A:
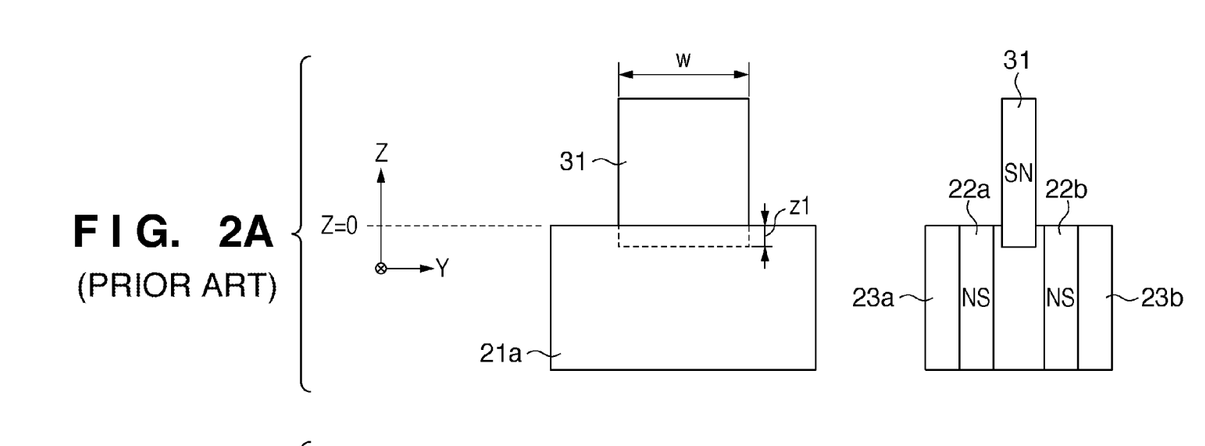
FIGS. 2A and 2B are front views and side views for explaining the effect of the conventional magnetic supporting mechanism.
Figure 2B:
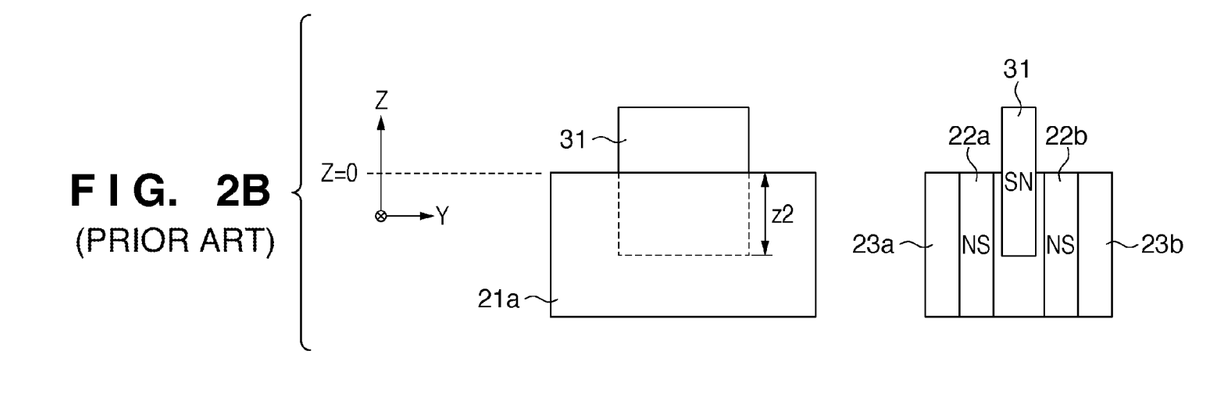
Figure 3A:
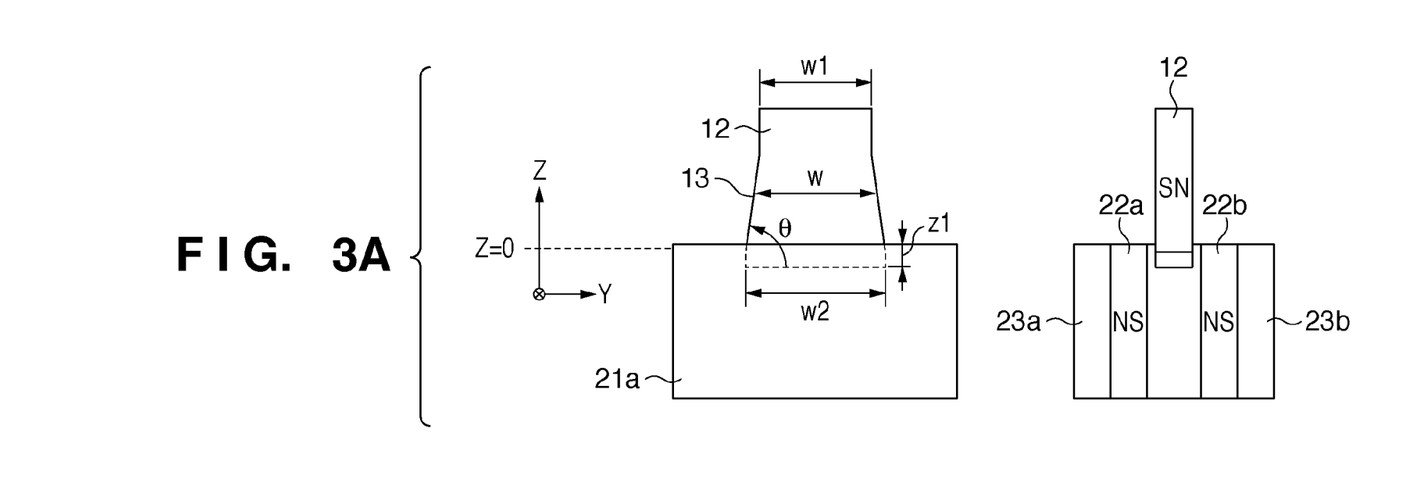
FIGS. 3A and 3B are front views and side views for explaining the effect of the magnetic supporting mechanism according to the present invention.
Figure 3B:
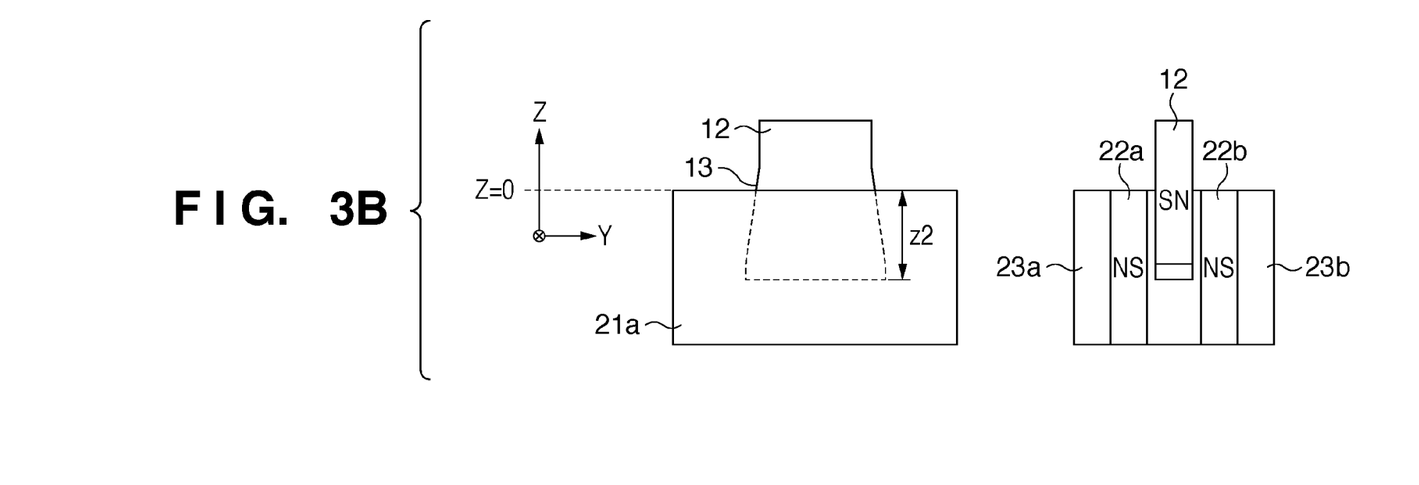
Figure 4:
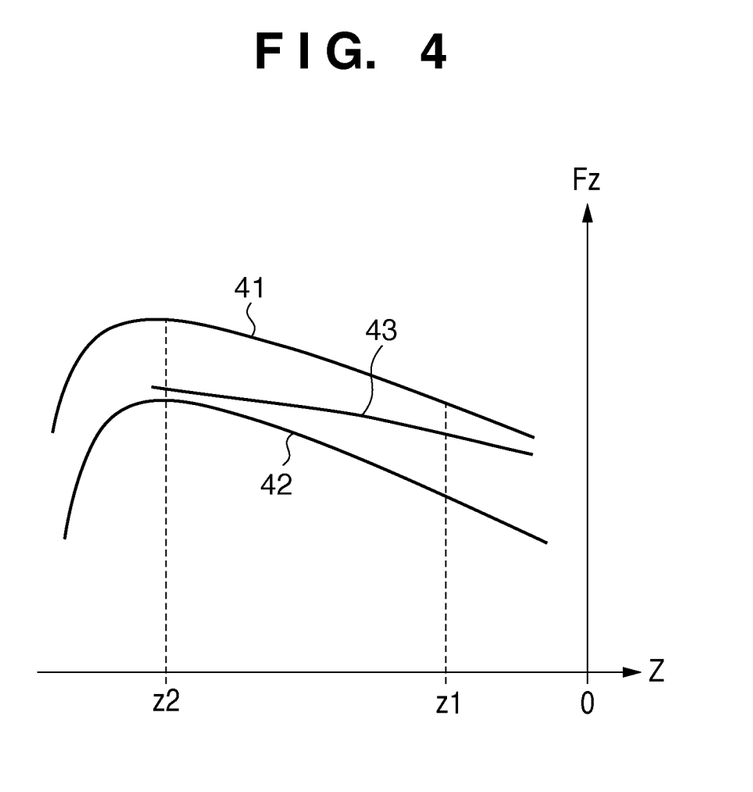
FIG. 4 is a graph showing in comparison the action of the conventional magnetic supporting mechanism and that of the magnetic supporting mechanism according to the present invention.

An action according to the present invention will be described with reference to FIGS. 2A to 4. FIGS. 2A and 2B are front views and side views schematically showing the conventional magnetic supporting mechanism. FIGS. 3A and 3B are front views and side views schematically showing the magnetic supporting mechanism according to the present invention. FIG. 4 illustrates the relationships between positions Z of the magnets of the movable units in the conventional magnetic supporting mechanism and the magnetic supporting mechanism according to the present invention, and their supporting forces Fz. In FIG. 4, curves 41 and 42 describe the characteristics of the conventional magnetic supporting mechanism, and a curve 43 describes the characteristic of the magnetic supporting mechanism according to the present invention. The movable magnet 31 of the conventional magnetic supporting mechanism shown in FIGS. 2A and 2B has different widths w in the curves 41 and 42. In the curve 42, the movable magnet 31 has a width w smaller than a width w1 of the third magnet 12 in this example shown in FIG. 3A. In the curve 41, the movable magnet 31 has a width w larger than a width w2 of the third magnet 12 in this example shown in FIG. 3A. Note that the same reference numerals as in FIGS. 1A and 1B denote the same constituent elements in FIGS. 2A and 2B.

As shown in the curve 41 or 42 in FIG. 4, as the movable magnet 31 moves in the −Z direction from an insertion position Z1 shown in FIG. 2A, the supporting force Fz increases up to a position Z2 shown in FIG. 2B. As the movable magnet 31 further moves in the −Z direction, the supporting force Fz rapidly reduces after becoming nearly constant.

In contrast, as shown in the curve 43 in FIG. 4, in this embodiment, the slope of a change in supporting force as the third magnet 12 is inserted from a position Z1 shown in FIG. 3A to a position Z2 shown in FIG. 3B is smaller than that in the prior art. In this embodiment, when the third magnet 12 moves in the −Z direction, the inclined portions 13 formed on their two end faces reduction of the effective width or area across which the magnetic supporting mechanism 100 receives a force from the magnetic field as compared with a case in which a rectangular magnet with the constant width w2 moves in the −Z direction. This makes it possible to suppress an increase in supporting force upon moving the third magnet 12 in the −Z direction. Hence, the present invention is applicable not to a region where the supporting force increases up to a predetermined position when the movable magnet moves in the −Z direction using the conventional structure, that is, a narrow region where the supporting force as described in Japanese Patent Laid-Open No. 2003-343559 (FIG. 4) becomes nearly constant, but to a wider range. Also, since no actuator to be driven upon being supplied with power is used, no heat due to the power is generated. Moreover, even if an actuator is used, heat generation can be suppressed because a change in supporting force is decreased by the present invention and a force to be adjusted by the actuator is therefore small.

The smaller the angle θ of the inclined portions 13 of the third magnet 12 shown in FIG. 3A, the greater the obtained effect of suppressing an increase in supporting force upon moving the third magnet 12 in the −Z direction becomes. Reducing the angle θ amounts to increasing the difference between the curves 41 and 42 shown in FIG. 4, so the slope of the curve 43 in the range of the positions Z2 to Z1 eventually becomes opposite in sign to that shown in FIG. 4 as the inclination angle θ reduces.

Although the magnetic supporting mechanism 100 in this embodiment is desirably built in an apparatus which performs self weight compensation, such as the light-shielding apparatus 200 described with reference to FIG. 7, it may be applied to other apparatuses which require self weight compensation. The magnetic supporting mechanism 100 in this embodiment is applicable to, for example, an apparatus which supports a supporting target by means of a magnetic repulsive force in a noncontact manner, such as a stage apparatus which relatively and movably holds a wafer (substrate) and a reticle (original) in a semiconductor manufacturing apparatus.

[Second Embodiment]

Figures 5A, 5B:
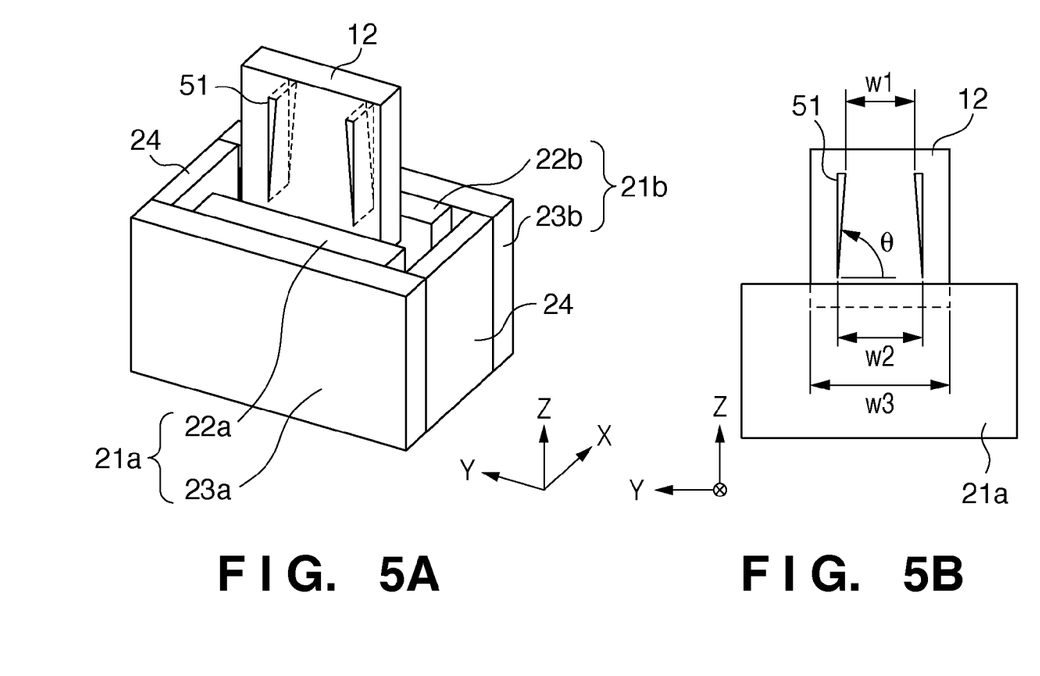
FIGS. 5A to 5C are a perspective view, front view, and side view showing a magnetic supporting mechanism in the second embodiment according to the present invention.
Figure 5C:
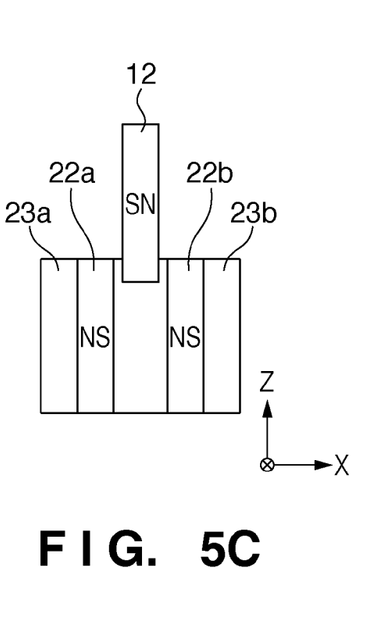

A magnetic supporting mechanism in the second embodiment will be described next with reference to FIGS. 5A to 5C. Note that the same reference numerals as in the first embodiment denote the same constituent elements in the second embodiment, and a description thereof will not be given. FIGS. 5A to 5C are a perspective view, front view, and side view showing the configuration of the magnetic supporting mechanism in the second embodiment. The second embodiment is different from the first embodiment in that in the former partially cutout holes 51 are formed in a third magnet 12 as a movable unit, instead of forming inclined portions on it. The holes 51 can adopt all shapes such as a triangular shape, a quadrangular shape, other polygonal shapes, a circular shape, and an elliptical shape. Also, holes and inclined portions may be used in combination. Moreover, one or a plurality of holes may be used.

As in the first embodiment, when the third magnet 12 moves in the −Z direction, the holes 51 reduce the effective width or area across which the magnetic supporting mechanism receives a force from the magnetic field as the third magnet 12 moves in the −Z direction, as compared with a case in which a magnet with an effective width w3 moves in the −Z direction. This makes it possible to suppress an increase in supporting force upon moving the third magnet 12 in the −Z direction.

Note that the effective width means the effective dimension or area across which the magnetic forces from magnetic poles that face each other act, and corresponds to the overall dimension {w3−(w2−w1)} of the third magnet 12 of in the Y direction, excluding the dimension of the holes 51 in the Y direction, in the second embodiment.

[Third Embodiment]

Figure 6A:
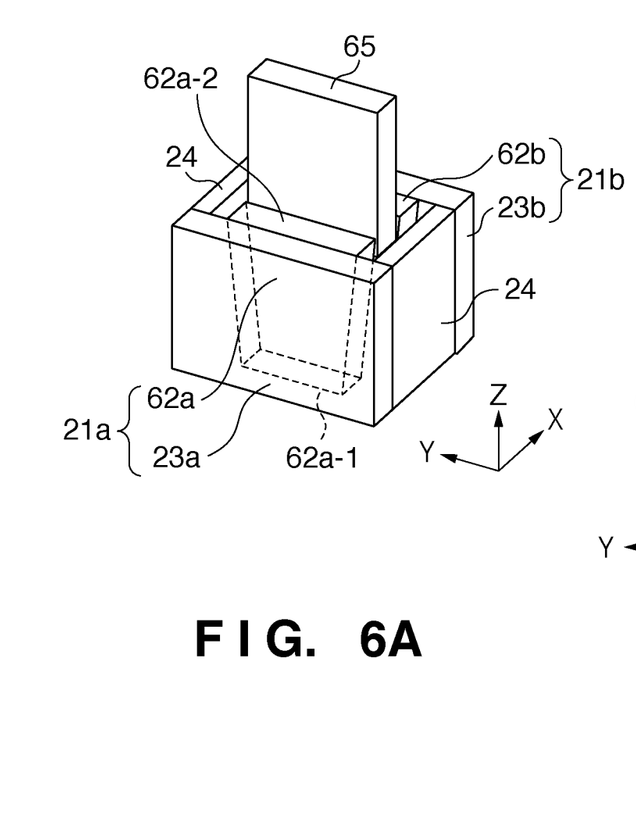
FIGS. 6A to 6C are a perspective view, front view, and side view showing a magnetic supporting mechanism in the third embodiment according to the present invention.
Figure 6B:
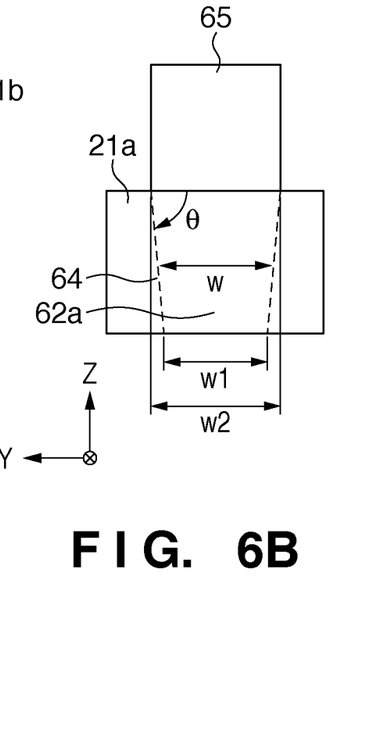
Figure 6C:
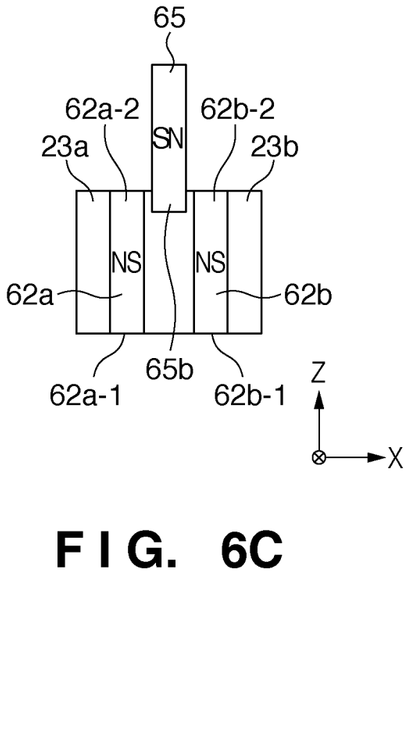

A magnetic supporting mechanism in the third embodiment will be described next with reference to FIGS. 6A to 6C. The same reference numerals as in the first embodiment denote the same constituent elements in the third embodiment, and a description thereof will not be given. FIGS. 6A to 6C are a perspective view, front view, and side view showing the configuration of the magnetic supporting mechanism in the third embodiment. The third embodiment is different from the first embodiment in that in the former a third magnet 65 has a rectangular shape without any inclined portions or holes, and inclined portions 64 are formed on first and second magnets 62a and 62b.

The inclined portions 64 are formed at the two ends of the first and second magnets 62a and 62b in the Y direction. The inclined portions 64 are formed such that the effective width across which a magnetic force acts in the Y direction is wider at second ends 62a-2 and 62b-2 opposite to first ends 62a-1 and 62b-1 which are on the side of an end 65b of the third magnet 65, which is inserted between the first and second magnets 62a and 62b, than at the first ends 62a-1 and 62b-1. In other words, the inclined portions 64 are formed such that the effective width or area across which a magnetic force acts in the +Z direction is wide. Again, in other words, the inclined portions 64 are formed such that the effective width or area across which a magnetic force acts narrows such that the rate of increase in area that the pole face of the third magnet 65 overlaps those of the first and second magnets 62a and 62b gets lower as the third magnet 65 is inserted deeper. The inclined portions 64 may be linear or curved. Also, holes may be formed and the holes and inclined portions may be used in combination, as in the second embodiment. However, the first and second magnets 62a and 62b must have the same shape.

In the third embodiment, when the third magnet 65 moves in the −Z direction, the inclined portions 64 of the first and second magnets 62a and 62b reduce the effective width or area, as compared with a case in which the first and second magnets 62a and 62b are rectangular magnets with the width w2. This makes it possible to suppress an increase in supporting force upon moving the third magnet 65 in the −Z direction.

Note that the effective width means the effective dimension or area across which the magnetic forces from magnetic poles that face each other act, and corresponds to the widths w1<w<w2 in the Y direction in the third embodiment.

Figure 8:
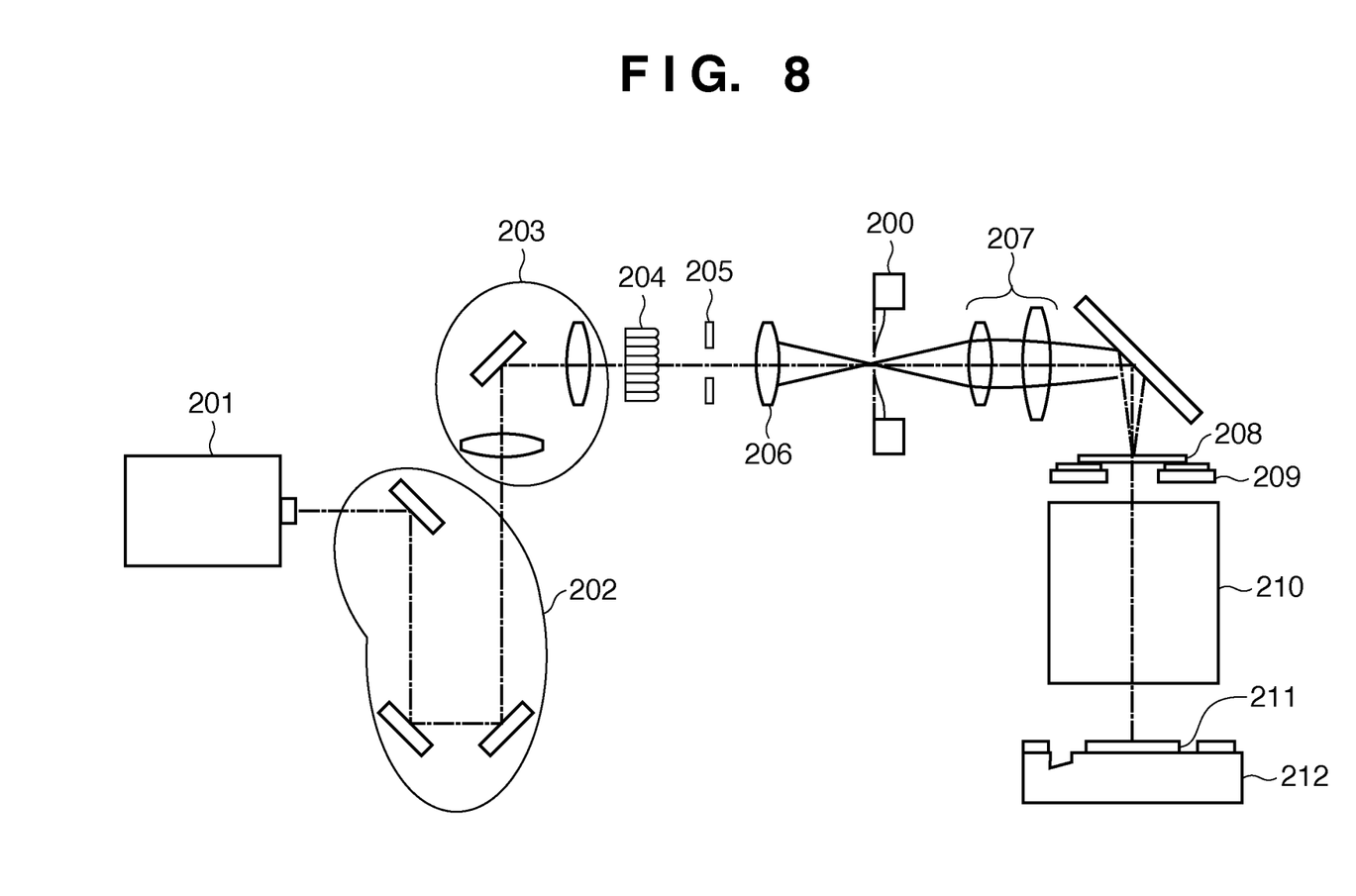
FIG. 8 is a schematic configuration diagram showing an example in which the light-shielding apparatus to which the magnetic supporting mechanism in one of the embodiments according to the present invention is applied to an exposure apparatus.

FIG. 8 is a schematic configuration diagram showing an example in which the light-shielding apparatus to which the magnetic supporting mechanism in one of the embodiments according to the present invention is applied to an exposure apparatus. Light emitted by an excimer laser 201 serving as a light source is guided to an optical path adjusting optical system 202, an illumination shape adjusting optical system 203, an optical integrator 204, and an aperture stop 205. The light having passed through the aperture stop 205 forms an image on a light-shielding apparatus 200 using a lens 206. The light having passed through an aperture area formed by the light-shielding apparatus 200 is guided to an imaging optical system 207. The light transmitted through the imaging optical system 207 is applied to a reticle 208 placed on a reticle stage 209. The light transmitted through the reticle 208 is projected onto a wafer 211, placed on a wafer stage 212, by a projection optical system 210. The light-shielding apparatus to which the magnetic supporting mechanism in one of the embodiments according to the present invention is applied is applicable to both a full-field exposure apparatus and a scanning exposure apparatus.

A device (for example, a semiconductor integrated circuit device or a liquid crystal display device) is manufactured by a step of exposing a substrate, coated with a photosensitive agent, using the exposure apparatus in the aforementioned embodiment, a development step of developing the photosensitive agent, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-258403, filed Nov. 11, 2009, which is hereby incorporated by reference herein in its entirety.

What is claimed is:

1. A magnetic supporting mechanism comprising:
a first magnet having a first magnetic pole;
a second magnet having a second magnetic pole opposed to the first magnetic pole; and
a third magnet having a third magnetic pole of a polarity identical to a polarity of the first magnetic pole and a fourth magnetic pole of a polarity identical to a polarity of the second magnetic pole,
wherein the first and second magnets are spaced apart along a first direction to provide a gap therebetween, with the first magnetic pole and the second magnetic pole facing each other,
wherein the third magnet is partially inserted, along a second direction, into the gap between the first magnet and the second magnet, with the first magnetic pole and the third magnetic pole facing each other and the second magnetic pole and the fourth magnetic pole facing each other, the second direction being perpendicular to the first direction,
wherein one of the third magnet or a pair of the first magnet and the second magnet comprises a stator unit, and the other of the third magnet or the pair of the first magnet and the second magnet comprises a movable unit that supports a supporting target, which is connected to the movable unit, and movable in the second direction,
wherein the third magnet has a first end and a second end, which is opposite the first end, and extends between the first end and the second end along the second direction,
wherein the first end stays inside the gap between the first magnet and the second magnet, while the second end stays outside the gap, and
wherein an effective width extends along a third direction, across which a magnetic force acts, and is narrower at the second end than the first end, the third direction being perpendicular to both the first direction and the second direction.

2. The mechanism according to claim 1, wherein the width of the third magnet tapers between the first end and the second end.

3. A magnetic supporting mechanism:
a first magnet having a first magnetic pole;
a second magnet having a second magnetic pole opposed to the first magnetic pole; and
a third magnet having a third magnetic pole of a polarity identical to a polarity of the first magnetic pole and a fourth magnetic pole of a polarity identical to a polarity of the second magnetic pole,
wherein the first and second magnets are spaced apart along a first direction to provide a gap therebetween, with the first magnetic pole and the second magnetic pole facing each other,
wherein the third magnet is partially inserted, along a second direction, into the gap between the first magnet and the second magnet, with the first magnetic pole and the third magnetic pole facing each other and the second magnetic pole and the fourth magnetic pole face facing each other, the second direction being perpendicular to the first direction,
wherein one of the third magnet or a pair of the first magnet and the second magnet comprises a stator unit, and the other of the third magnet or the pair of the first magnet and the second magnet comprises a movable unit that supports a supporting target, which is connected to the movable unit, and movable in the second direction,
wherein the third magnet has a first end and a second end, which is opposite the first end, and extends between the first end and the second end along the second direction,
wherein the first end stays inside the gap between the first magnet and the second magnet, while the second end stays outside the gap, and
wherein when viewed from the first direction, a rate of increase in an area in which the third magnet overlaps with the first and second magnets decreases as the third magnet is inserted deeper in the gap between the first magnet and the second magnet along the second direction.

4. An exposure apparatus comprising:
a stage apparatus that relatively and movably holds a substrate and an original;
an illumination apparatus that forms illumination light to transfer a pattern of the original onto the substrate by exposure;
a driving unit configured to drive a light-shielding unit of the illumination apparatus; and
a magnetic supporting mechanism supporting the driving unit and comprising:
a first magnet having a first magnetic pole;
a second magnet having a second magnetic pole opposed to the first magnetic pole; and
a third magnet having a third magnetic pole of a polarity identical to a polarity of the first magnetic pole and a fourth magnetic pole of a polarity identical to a polarity of the second magnetic pole, wherein the first and second magnets are spaced apart along a first direction to provide a gap therebetween, with the first magnetic pole and the second magnetic pole facing each other, wherein the third magnet is partially inserted, along a second direction, into the gap between the first magnet and the second magnet, with the first magnetic pole and the third magnetic pole facing each other and the second magnetic pole and the fourth magnetic pole face facing each other, the second direction being perpendicular to the first direction, wherein one of the third magnet or a pair of the first magnet and the second magnet comprises a stator unit, and the other of the third magnet or the pair of the first magnet and the second magnet comprises a movable unit that supports a supporting target, which is connected to the movable unit, and movable in the second direction, wherein the third magnet has a first end and a second end, which is opposite the first end, and extends between the first end and the second end along the second direction, wherein the first end stays inside the gap between the first magnet and the second magnet, while the second end stays outside the gap, and wherein an effective width extends along a third direction, across which a magnetic force acts, and is narrower at the second end than the first end, the third direction being perpendicular to both the first direction and the second direction.

5. A device manufacturing method comprising the steps of:
exposing a substrate using an exposure apparatus; and
developing the exposed substrate,
wherein the exposure apparatus comprises:
a stage apparatus that relatively and movably holds a substrate and an original;
an illumination apparatus that forms illumination light to transfer a pattern of the original onto the substrate by exposure;
a driving unit configured to drive a light-shielding unit of the illumination apparatus; and
a magnetic supporting mechanism supporting the driving unit and comprising:
a first magnet having a first magnetic pole;
a second magnet having a second magnetic pole opposed to the first magnetic pole; and
a third magnet having a third magnetic pole of a polarity identical to a polarity of the first magnetic pole and a fourth magnetic pole of a polarity identical to a polarity of the second magnetic pole, wherein the first and second magnets are spaced apart along a first direction to provide a gap therebetween, with the first magnetic pole and the second magnetic pole facing each other, wherein the third magnet is partially inserted, along a second direction, into the gap between the first magnet and the second magnet, with the first magnetic pole and the third magnetic pole facing each other and the second magnetic pole and the fourth magnetic pole face facing each other, the second direction being perpendicular to the first direction, wherein one of the third magnet or a pair of the first magnet and the second magnet comprises a stator unit, and the other of the third magnet or the pair of the first magnet and the second magnet comprises a movable unit that supports a supporting target, which is connected to the movable unit, and movable in the second direction, wherein the third magnet has a first end and a second end, which is opposite the first end, and extends between the first end and the second end along the second direction, wherein the first end stays inside the gap between the first magnet and the second magnet, while the second end stays outside the gap, and wherein an effective width extends along a third direction, across which a magnetic force acts, and is narrower at the second end than the first end, the third direction being perpendicular to both the first direction and the second direction.

* * * * *